US012568576B2

(12) United States Patent
Rathburn

(10) Patent No.: US 12,568,576 B2
(45) Date of Patent: Mar. 3, 2026

(54) STUD BUMPED PRINTED CIRCUIT ASSEMBLY

(71) Applicant: James Rathburn, Rogers, MN (US)

(72) Inventor: James Rathburn, Rogers, MN (US)

( * ) Notice: Subject to any disclaimer, the term of this patent is extended or adjusted under 35 U.S.C. 154(b) by 298 days.

(21) Appl. No.: 17/757,003

(22) PCT Filed: Nov. 25, 2020

(86) PCT No.: PCT/US2020/062436
§ 371 (c)(1),
(2) Date: Jun. 7, 2022

(87) PCT Pub. No.: WO2021/108724
PCT Pub. Date: Jun. 3, 2021

(65) Prior Publication Data
US 2023/0041747 A1 Feb. 9, 2023

Related U.S. Application Data

(60) Provisional application No. 62/940,391, filed on Nov. 26, 2019.

(51) Int. Cl.
*H05K 1/02* (2006.01)
*H05K 1/11* (2006.01)
*H05K 3/40* (2006.01)
*H05K 3/46* (2006.01)
(Continued)

(52) U.S. Cl.
CPC ............. *H05K 1/0298* (2013.01); *H05K 1/11* (2013.01); *H05K 3/4046* (2013.01); *H05K 3/4658* (2013.01); *H05K 3/4679* (2013.01); *H05K 1/09* (2013.01); *H05K 1/111* (2013.01);
(Continued)

(58) Field of Classification Search
CPC .. H05K 1/0298; H05K 3/4046; H05K 3/4658; H05K 3/4679; H05K 2201/10242; H05K 2203/049; H05K 1/09; H05K 3/4647; H01L 21/4853; H01L 23/49811;
(Continued)

(56) References Cited

U.S. PATENT DOCUMENTS 5,046,238 A * 9/1991 Daigle ................. H05K 3/4617
228/175
6,326,559 B1 * 12/2001 Yoshioka ............. H05K 3/0035
174/262
(Continued)

OTHER PUBLICATIONS

"International Search Report and Written Opinion" PCT/US2020/062436, Apr. 2, 2022, 11 pgs.

*Primary Examiner* — Ishwarbhai B Patel
(74) *Attorney, Agent, or Firm* — Carlson, Caspers, Vandenburgh & Lindquist, P.A.

(57) ABSTRACT

A circuit board having a plurality of conductive layers including a first conductive layer and a second conductive layer is provided. The circuit board includes a plurality of non-conductive layers in-between respective conductive layers of the plurality of conductive layers. The plurality of non-conductive layers include at least a first non-conductive layer disposed between the first conductive layer and the second conductive layer. At least one collapsed stud bump extends at least partially through the first non-conductive layer to electrically couple the first conductive layer to the second conductive layer.

6 Claims, 7 Drawing Sheets

(51) Int. Cl.
*H05K 1/09* (2006.01)
*H05K 1/18* (2006.01)

(52) U.S. Cl.
CPC ..... *H05K 1/18* (2013.01); *H05K 2201/10242* (2013.01); *H05K 2203/049* (2013.01)

(58) Field of Classification Search
CPC ... H01L 2224/1134; H01L 2224/16227; H01L 2224/81192
See application file for complete search history.

(56) References Cited

U.S. PATENT DOCUMENTS

| | | | | |
|---|---|---|---|---|
| 6,395,993 | B1 * | 5/2002 | Nakamura | H05K 3/4635 361/767 |
| 7,521,284 | B2 * | 4/2009 | Miranda | H01L 24/13 257/E21.503 |
| 7,576,288 | B2 * | 8/2009 | Kondo | H05K 3/4635 174/262 |
| 8,922,005 | B2 * | 12/2014 | Hu | H01L 25/105 257/737 |
| 10,497,657 | B1 * | 12/2019 | Lu | H01L 24/14 |
| 2009/0091024 | A1 | 4/2009 | Zeng et al. | |
| 2011/0254156 | A1 | 10/2011 | Lin | |
| 2012/0161317 | A1 * | 6/2012 | Rathburn | H01L 23/49811 257/738 |
| 2013/0223034 | A1 * | 8/2013 | Rathburn | H05K 1/18 361/767 |
| 2014/0124920 | A1 | 5/2014 | Chuang et al. | |
| 2019/0067140 | A1 * | 2/2019 | Hsu | H01L 24/02 |
| 2019/0348385 | A1 * | 11/2019 | Lu | H01L 21/486 |

* cited by examiner

STUD BUMPED PRINTED CIRCUIT ASSEMBLY

RELATED APPLICATIONS

This application is a 35 U.S.C. § 371 National Stage Application of PCT/US2020/062436, filed Nov. 25, 2020, which claims the benefit of priority to U.S. Provisional Application No. 62/940,391, filed on Nov. 26, 2019, the disclosures of which are hereby incorporated herein by reference in their entirety.

BACKGROUND

Printed circuit boards are often assembled by creating multiple sub-assemblies and laminating the sub-assemblies together. This creates a circuit board stack including multiple layers of insulating dielectric materials with layers of printed or etched copper circuitry at appropriate layers in the stack. For example, a first sub-assembly including one or more copper layers with dielectric layers therebetween can be laminated to a second sub-assembly including one or more copper layers with dielectric layers therebetween. If a stack includes more than two sub-assemblies that are to be laminated, each sub-assembly added in a separate lamination step, such that the process involves multiple sequential lamination steps.

The copper layer(s) in one sub-assembly aren't electrically coupled to the copper layer(s) in another sub-assembly after lamination, because the adhesive material used to secure the sub-assemblies to one another is a dielectric, like prepreg, and that dielectric forms a contiguous layer between the respective sub-assemblies. To electrically couple copper layers in one sub-assembly to copper layers in another sub-assembly, vertical interconnects, normally called vias, are formed in the laminated stack by drilling holes therein. The holes can be drilled by mechanical or laser means and plated with copper to connect the circuit layers between and within sub-assemblies in desired locations.

Stud bumps are used to mount packaged or bare semiconductor dies in a flip-chip manner to a circuit board. To create a stud bump, a thin wire made of gold or copper is wire bonded to a bond pad on a semiconductor die using ultrasonic, thermal, or compression applied by a bonding tool. This takes the round wire and creates a ball or stud connection that is a function of the wire diameter. The bonding machine breaks or melts the wire, such that the ball (stud bump) remains on the bond pad. These stud bumps are subsequently used in a vertical bonding operation where the bumps are mated with corresponding pads on a circuit board. A surface finish is placed on both the bond pads of the semiconductor die prior to the wire bond as well as on the bond pads of the circuit board to which the stud bumps are mated. The surface finish is usually of a noble nature, such as gold or palladium plus gold. In most cases, the bonding operation to mate the stud bumps to the pads on the circuit board collapses the bumps with a thermo-compression bond often with slight ultrasonic motion to create a stronger joint. The semiconductor-circuit board interface is often supported by a compound called underfill which is essentially a bonding material or adhesive that solidifies between the semiconductor die and the substrate. The underfill, when curing, can provide some contracting action that pulls the interconnects together which counteracts the mechanical stresses that may cause joints to shear or separate.

BRIEF DESCRIPTION

Embodiments for a circuit board having a plurality of conductive layers including a first conductive layer and a second conductive layer is provided. The circuit board includes a plurality of non-conductive layers in-between respective conductive layers of the plurality of conductive layers. The plurality of non-conductive layers include at least a first non-conductive layer disposed between the first conductive layer and the second conductive layer. At least one collapsed stud bump extends at least partially through the first non-conductive layer to electrically couple the first conductive layer to the second conductive layer.

Embodiments for a method of fabricating a circuit board are provided. The method includes providing a first sub-assembly having a first conductive layer and a first stud bump extending from the first conductive layer. The first stud bump is exposed on a first surface of the first sub-assembly. A second sub-assembly is also provided. The second sub-assembly includes a second conductive layer defining a first bond pad. The first bond pad is exposed on a second surface of the second sub-assembly. At least one of the first surface and the second surface includes a bond material thereon. The first sub-assembly is aligned with the second sub-assembly such that the first surface opposes the second surface and the first stud bump is aligned with the first bond pad. The first sub-assembly is laminated to the second sub-assembly while the first and second sub-assembly are aligned. Laminating includes softening the bond material and pressing the first stud bump against the first bond pad to collapse the first stud bump. After softening the bond material, the bond material is hardened to bond the first sub-assembly to the second sub-assembly and secure the first stud bump in collapsed form in contact with the first bond pad.

Embodiments for a method of fabricating a printed circuit board (PCB) are provided. The method includes providing at least four sub-assemblies. The at least four sub-assemblies are aligned such that adjacent sub-assemblies have at least one stud bump aligned with at least one bond pad on an opposing surface of an adjacent sub-assembly. The four sub-assemblies are laminated together simultaneously while the at least four sub-assemblies are aligned. Laminating includes softening bond material and pressing aligned stud bumps against their aligned bond pad to collapse the aligned stud bumps. After softening the bond material, the bond material is hardened to bond the at least four sub-assemblies together and secure the aligned stud bumps in collapsed form in contact with the aligned bond pads.

DRAWINGS

Understanding that the drawings depict only exemplary embodiments and are not therefore to be considered limiting in scope, the exemplary embodiments will be described with additional specificity and detail through the use of the accompanying drawings, in which:

FIG. 1 is a cross-sectional view of an example portion of a printed circuit board (PCB), wherein respective sub-assemblies are electrically coupled together with stud bumps;

FIGS. 2A-H are cross-sectional views of example bases from which a sub-assembly can be formed;

FIGS. 6A and 6B are cross sectional views of an example lamination process for forming a PCB from more than two sub-assemblies.

DETAILED DESCRIPTION

Existing circuit board lamination processes have several consequences. For example, the laser or mechanical drilling operations used to create the via holes increase the overall space required for the via because the drilling operations remove extra material beyond what is necessary for effective plating. The extra material is removed to allow for tolerance in the location of the via and material movement during fabrication. Thus, the process required to create the via requires additional space over that required for the via itself. Additionally, once a hole is plated, the via location are often a source of failure modes as there can be voids in plating that result in open circuits or abnormalities that may later fail during stress or usage. Via sizes can also be a limiting factor due to the aspect ratio of the hole itself to the thickness of the material drilled through being important regarding the ability for plating chemistry to enter the hole and properly plate coper as and where desired. In most cases, a bonding material is used to merge the circuit and dielectric layers together in the final circuit stack, and this bonding material must also be drilled depending on the construction. In many cases, the bonding material must also be metalized through the vertical section of the vias which can be problematic in some cases where plasma is used to clean the via locations or a material does not wet with chemistry the same way as the base dielectric.

The laminating steps themselves also have consequences. For circuit boards in which more than two separate sub-assemblies are laminated together, each subsequent sub-assembly requires an additional lamination step, thereby subjecting the previously laminated sub-assemblies to the heat and pressure of lamination multiple times. This repeated heating and cooling of the sub-assemblies can embed stress into the stack, and this embedded stress can cause issues over time.

Figure 1:
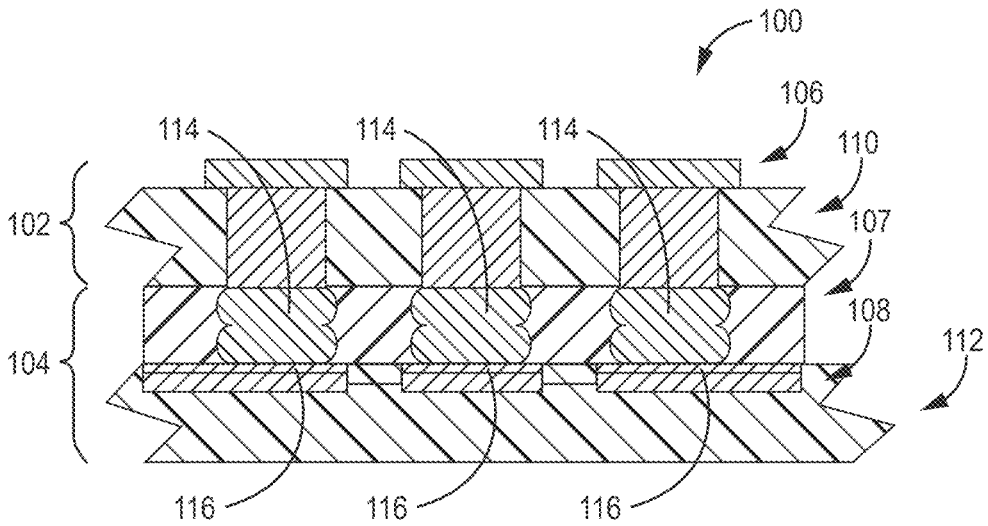

FIG. 1 is a cross-sectional view of an example portion of a printed circuit board (PCB) 100, wherein respective sub-assemblies 102, 104 are electrically coupled together with stud bumps 114. The PCB 100 includes a plurality of conductive layers 106, 108 and a plurality of non-conductive layers 107, 110, 112 forming a laminated stack. Each conductive layer 106, 108 is composed of an electrically conductive material, typically copper, and patterned to form electrically conductive interconnects. The conductive layers 106, 108 are separated by a respective insulating (non-conductive) layers 107, 110. It is noted that the number of conductive and non-conductive layers of the PCB 100 is merely a design choice and that in practice more than two of each such layers are typically used. Each non-conductive layer is made of a non-conductive material such as liquid crystal polymer (LCP), FR-4 epoxy, Teflon, polyimide, Ajinomoto build-up film (ABF), polyamide, or other known dielectric materials. Any of the available variants of LCP can be used, wherein different variants have different melt temperatures providing some latitude in lamination temperature and pressure ranges.

One or more compressed stud bumps 114 can be used to electrically couple respective conductive layers 106, 108 in the PCB 100 together. The compressed stud bump(s) 114 provide at least part of a vertical conductive path between the first conductive layer 106 and the second conductive layer 108. A surface finish layer 116 can be disposed on the second conductive layer 108, between the stud bumps 114 and the second conductive layer 108. The surface finish layer 116 can be composed of one or more noble metals, such as gold or palladium plus gold.

PCB 100 is fabricated by creating a plurality of sub-assemblies 102, 104 and coupling the sub-assemblies 102, 104 together into a laminated stack. The sub-assemblies 102, 104 are coupled together by lamination in which non-conductive layer(s) 107, 110 at the junction of two sub-assemblies are heated, pressed together, and allowed to cool such that the non-conductive layer bonds the two sub-assemblies together.

Figures 2A, 2B, 2C, 2D, 2E, 2F, 2G, 2H:
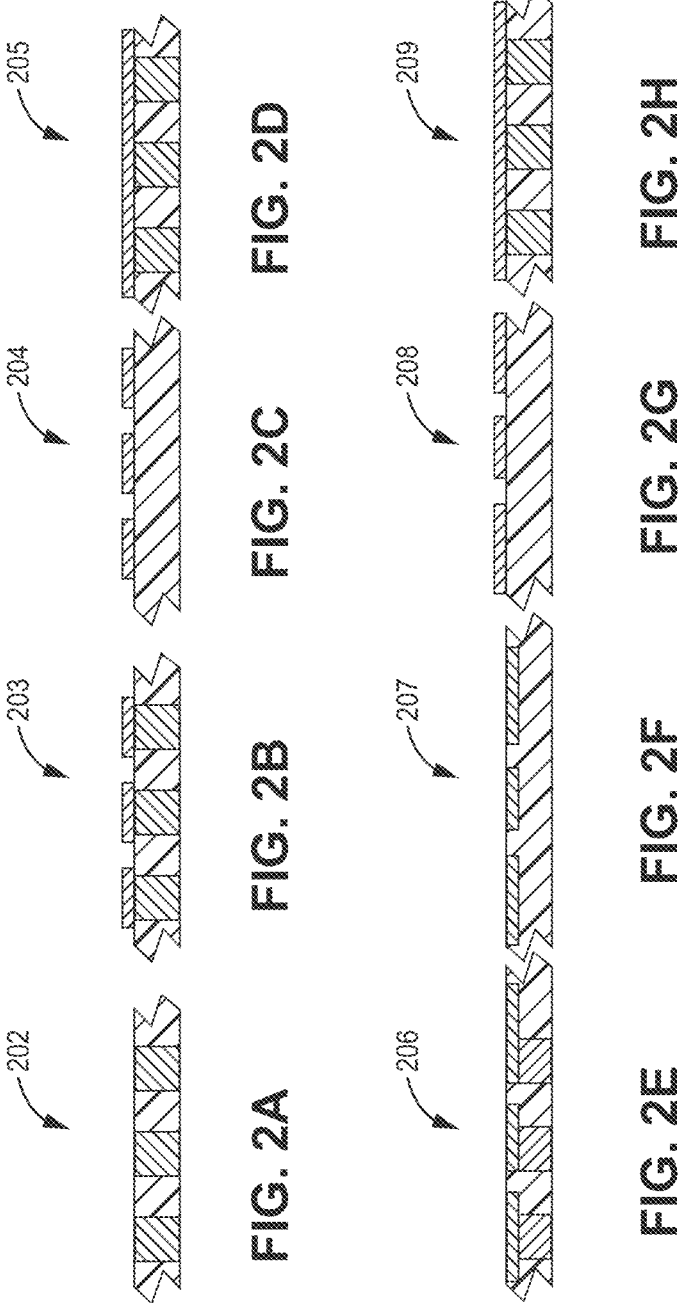
Figures 3A, 3B, 3C, 3D, 3E, 3F, 3G, 3H:
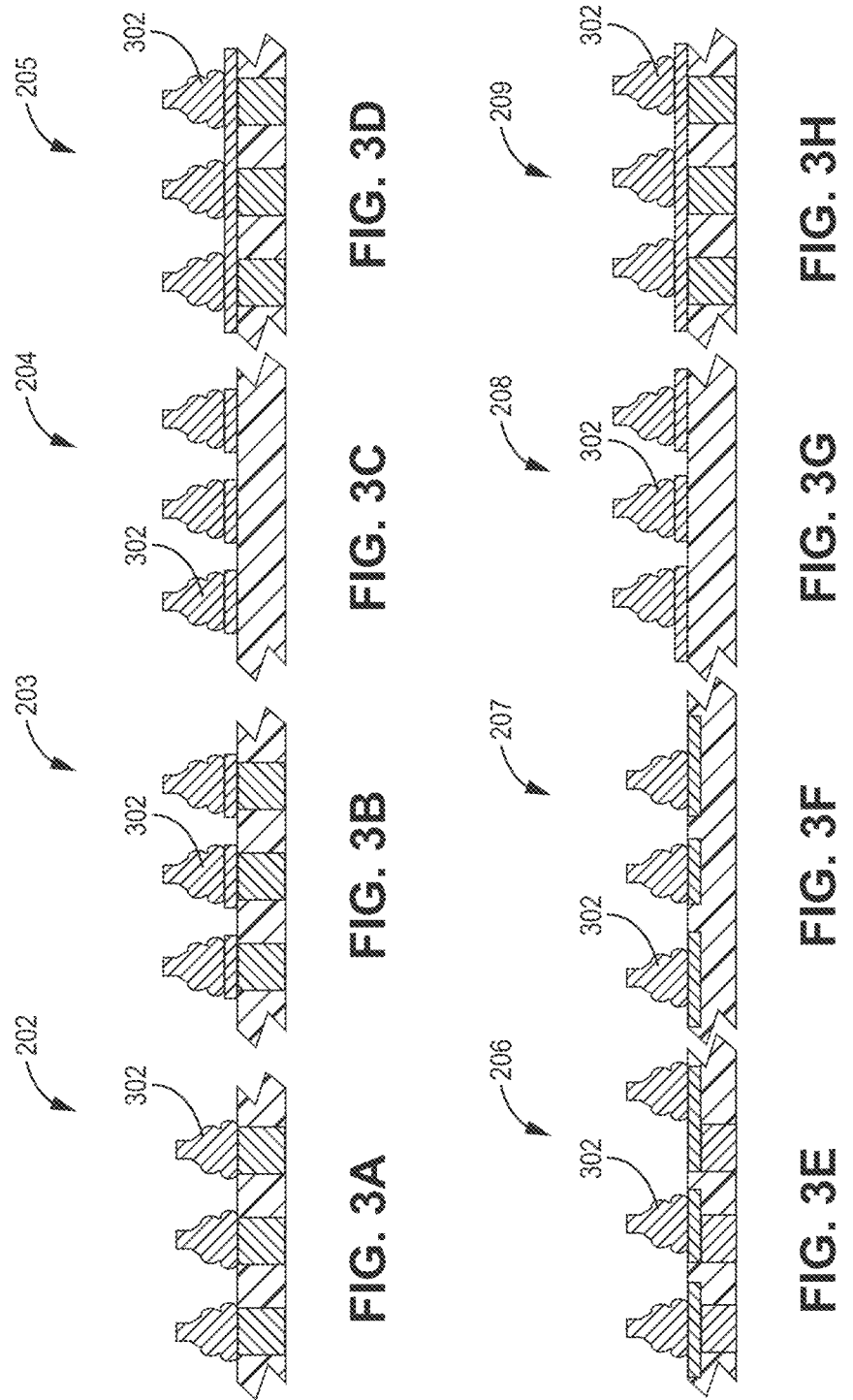
FIGS. 3A-3H are cross-sectional views of the example bases having stud bumps bonded to the target areas.

FIGS. 2A-H are cross-sectional views of example bases 202-209 from which a sub-assembly can be formed. A single sub-assembly can include one or more of the example bases 202-209 in/on a single non-conductive layer therein. Each base 202-209 is composed of a non-conductive material with conductive material therethrough or thereon. The conductive material defines a target location for placement of a stud bump. FIG. 2A illustrates a base having a plurality of solid conductive vias extending therethrough. FIG. 2B illustrates a base having a plurality of bond pads defined in a conductive layer with a plurality of solid copper vias extending through a non-conductive material below the bond pads. FIG. 2C illustrates a plurality of bond pads defined in a conductive layer on a surface of a non-conductive base material. FIG. 2D illustrates a plurality of vias that all couple a common trace defined in a conductive layer on a surface of a base material. FIG. 2E illustrates a plurality of vias extending from respective traces defined in a conductive layer on a surface of a base material, FIG. 2F illustrates a plurality of traces embedded into a surface of a base material. FIG. 2G illustrates a plurality of traces defined in a conductive layer on a surface of a base material. FIG. 2H illustrates a conductive plane disposed on a surface of a base material. In an example, the conductive material in each of bases 202-209 is copper.

A stud bump can be bonded onto the exposed conductive material in any of bases 202-209. Depending on the metal content of the bump, which is typically gold but possibly copper, the target area onto which the bump is bonded can have a final finish that is conducive to a good mechanical bond. This finish is usually base copper of a desired thickness with a layer of nickel as a barrier layer to prevent copper diffusion, with additional layers of palladium and/or gold. Other suitable finish layers suitable for bonding stud bumps can be used. In some examples, no finish layer is used since the stud bump-target joint will be internal to final PCB, the joint won't be exposed to the environment and copper diffusion may not be an issue. As shown, the metal target structures can include a metal plane, a target pad such as with a conventional via target, an exposed solid copper full metal via, or a circuit trace which can be directly bumped. As mentioned above, a single exposed surface of a sub-assembly can have any one or more of the example target types thereon.

FIGS. 3A-3H are cross-sectional views of the example bases 202-209 having stud bumps 302 bonded to the target areas. The metalized targets on the bases 202-209 with optional surface material content are bumped with a stud bumping machine in accordance with known stud bumping techniques. The stud bumps can be composed of any suitable metal such as gold or copper. A plurality of such stud bumps can be bonded to a surface of a base 202-209 as a pattern of stud bumps. The pattern of bumps may optionally be plated provided the resulting bumps are the proper material content and physical size.

The size, shape, and location of the stud bumps is controllable and consistent with bump geometry based upon the source wire size which can be as small as 18 microns, although the subject matter described herein is also applicable to smaller wire sizes that may be developed in the future. Typical wire sizes are 25 microns, 50 microns, and 75 microns and the pattern of bumps can be created with almost limitless locations or bump count provided the spacing between bumps has adequate clearance for the bonding tool to place an adjacent bump without damaging an existing bump. The example sub-assemblies shown in FIGS. 3A-3H are very simple generic structures. The subject matter herein, however, is applicable to sub-assemblies with multiple conductive and non-conductive layers and complex circuit structures.

Figures 4A, 4B:
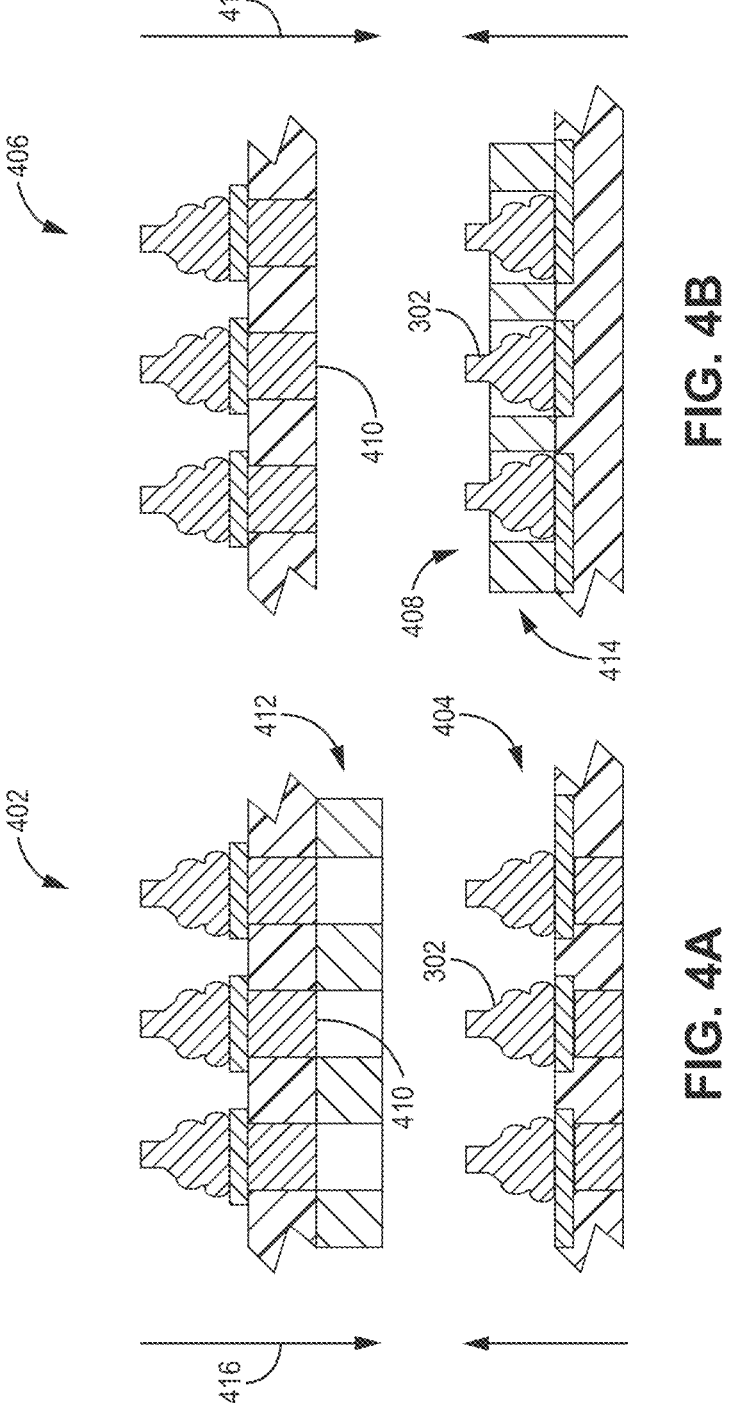
FIGS. 4A and 4B are cross-sectional views of example sub-assemblies being laminated together, wherein one or more stud bumps act as an electrical coupling between conductive layers on the respective sub-assemblies.

FIGS. 4A and 4B are cross-sectional views of example sub-assemblies 402-408 being laminated together, wherein one or more stud bumps 302 act as an electrical coupling between conductive layers on the respective sub-assemblies 402-408. To laminate two such sub-assemblies together, one sub-assembly 402, 406 has one or more stud bumps thereon and a mating sub-assembly 404, 408 has one or more corresponding pads 410 for the stud bumps to contact. The stud bump(s) 302 and pad(s) 410 are disposed at corresponding locations on their respective sub-assemblies such that they stud bump(s) 302 align with the corresponding pad(s) 410 and electrically couple desired conductive portions of one sub-assembly to the other sub-assembly. Alignment of the mating sub-assemblies can be accomplished with vision alignment or mechanical fixturing. Fixturing can provide clearance locations for bumps that may protrude from the mating surfaces.

In FIG. 4A a first sub-assembly 402 having one or more stud bumps 302 thereon is aligned with a mating second sub-assembly 404. A first surface 403 of the first sub-assembly 402 having exposed stud bumps 302 thereon is disposed facing a second surface 405 of the second sub-assembly 404 having mating pads 410 for the stud bumps 302 thereon. The stud bumps 302 of the first sub-assembly 402 are aligned with corresponding pads 410 on the second sub-assembly.

Similarly, in FIG. 4B a third sub-assembly 406 having one or more stud bumps 302 thereon is aligned with a mating fourth sub-assembly 408. A third surface 407 of the third sub-assembly 406 having exposed stud bumps 302 thereon is disposed facing a fourth surface 409 of the fourth sub-assembly 408 having mating pads 410 for the stud bumps 302 thereon. The stud bumps 302 of the third sub-assembly 406 are aligned with corresponding pads 410 on the fourth sub-assembly 408.

At least one of the mating surfaces 403, 405, 407, 409 of the mating sub-assemblies 402, 404, 406, 408 has a bond layer 412, 414. The bond layer 412, 414 is a layer of a non-conductive material that bonds the mating sub-assemblies together during lamination. The bond layer 412, 414 can be disposed on the surface having the stud bumps 302 thereon as shown in FIG. 4A and/or can be disposed on the surface having the pads 410 thereon as shown in FIG. 4B.

The bond layer can be disposed of any material suitable for bonding sub-assemblies during lamination, such as an adhesive film commonly used for printed circuit fabrication, or a cast liquid, or a fuse-able dielectric like LCP. In some examples, the bond layer 412, 414 is the same material as the base material, such as the case when LCP is used for both the bond layer 412 and a base material 411 of FIG. 4A.

For a bond layer 414 disposed on a surface of the stud bumps 302, the bond layer 414 can be placed over the stud bumps 302 after their formation. A bond layer 412 disposed on a surface with pads 410 can be placed after formation of the target metal areas, or the target metal areas can be formed in monolithic non-conductive layer (e.g., LCP) which acts as the base and the bond layer as discussed above. In some examples, material from the bond layer 412, 414 is removed to expose the stud bump(s) 302 or pad(s) 410 below the bond layer 412, 414 as is shown in FIGS. 4A and 4B. The material can be removed in any suitable manner such as by laser ablation, plasma etching, or in the case of a photosensitive material exposure and developed to remove unwanted material. In an alternative example, material from the bond layer 412, 414 remains overtop of the stud bump(s) 302 or pad(s) 410.

In any case, the opposed mating surfaces 403, 405, 407, 409 (with bond layer 412, 414 therebetween) are pressed together (416) and the sub-assemblies are heated to soften the bond layer 412, 414. The bond layer 412, 414 is then cooled and allowed to harden with the sub-assemblies pressed together to bond the sub-assemblies together. Pressing the sub-assemblies 402, 404, 406, 408 together causes the stud bump(s) 302 to contact their corresponding pad(s) 410. In examples where the bond layer 412, 414 remains overtop of the stud bump(s) 302 or pad(s) 410 the pressure of lamination causes the stud bump(s) 302 to penetrate through the bond layer 412, 414 to contact the pad(s) 410. In any case, the pressure forcing the stud bump(s) 302 into the pad(s) 410 collapses the stud bump(s) 302 causing the stud bump(s) 302 to shorten and widen increasing the contact area between the stud bump(s) 302 and the pad(s) 410. This results in non-bonded contact between the stud bump(s) 302 and the pad(s) 410. In an example, a predetermined stopping point for the lamination plates pressing the sub-assemblies together to ensure that the bumps are not over collapsed or misshapen, which may create an open or short circuit.

In an example, ultrasonic micro-motion is provided to one mating sub-assembly with respect to the other mating sub-assembly to enhance any mechanical coupling between the stud bump 302 and its corresponding mating pad 410. The stud bump(s) 302 maintain contact with the pad(s) 410 while the bond layer 412, 412 flows to surround the stud bump(s) 302 and harden therearound. After hardening/curing, the bond layer 412, 414 bonds the sub-assemblies together and holds the collapsed stud bump(s) 302 in contact with their mating pad(s) 410 on the other sub-assembly. The hardened bond material enhances the mechanical integrity of the electrical interconnect formed between the stud bump 302 and the pad 410. The bond material can flow to fill air gaps around the stud bumps, to reduce the chance of such air gaps exploding during a subsequent solder reflow. This creates a stud bump 302 that approximates a solid column of metal forming an electrically conductive coupling between a respective conductive member on one sub-assembly and a respective conductive member on a second sub-assembly.

Figure 5A:
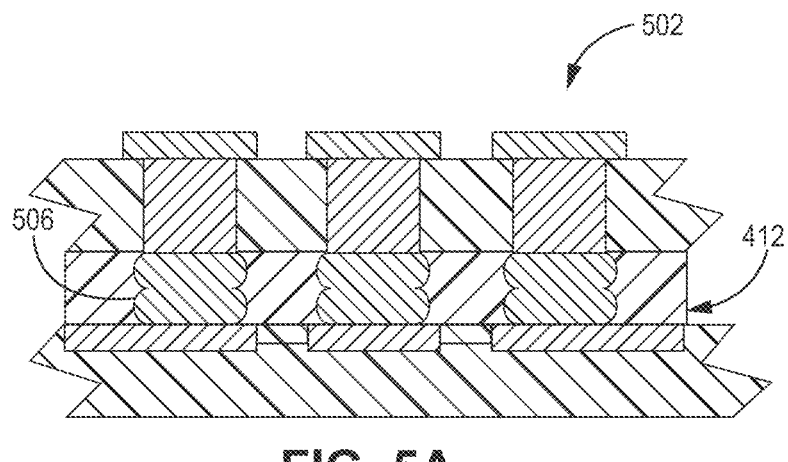
FIGS. 5A and 5B illustrate example laminated stacks formed by laminating the respective sub-assemblies together.
Figure 5B:
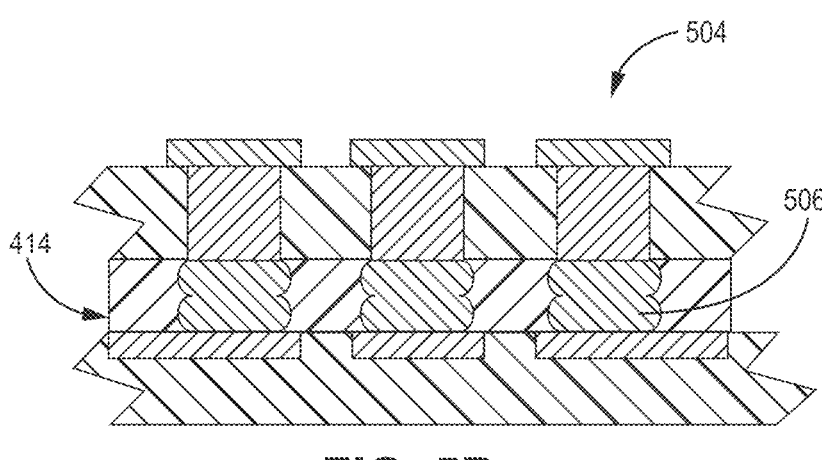

FIGS. 5A and 5B illustrate example laminated stacks 502, 504 formed by laminating the respective sub-assemblies 402, 404, 406, 408 together. As shown, collapsed stud bumps 506 extend through respective non-conductive bond layers 412, 414 to electrically couple respective conductive members on adjacent sub-assemblies together. In an example, one or more stud bumps can include multiple stud bumps formed/stacked on top of one another to form a higher aspect ratio connection.

Figure 6A:
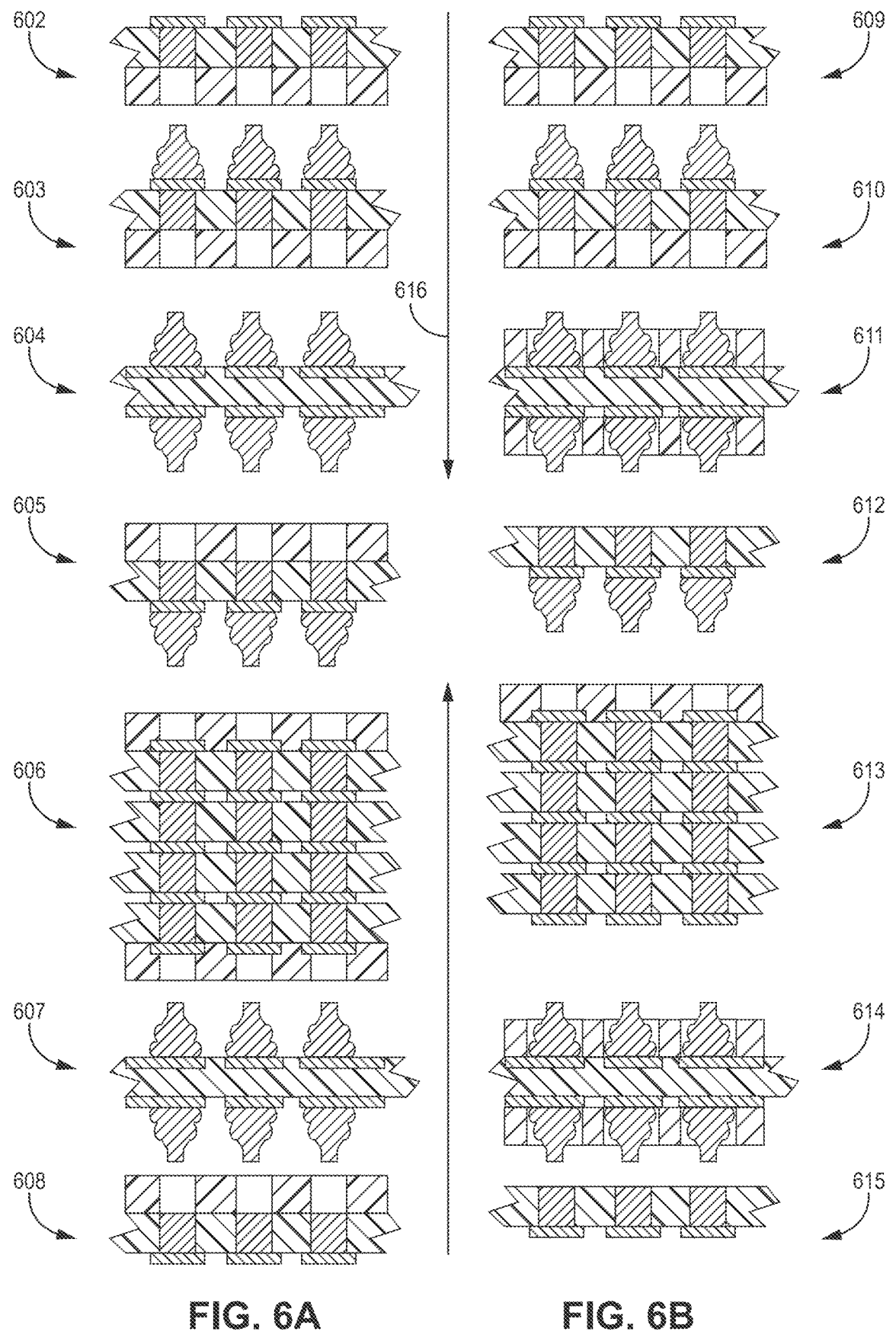

FIGS. 6A and 6B are cross sectional views of an example lamination process for forming a PCB from more than two sub-assemblies. These examples show lamination processes in which seven sub-assemblies are laminated together to form a PCB having stud bumps to form electrical coupling between adjacent sub-assemblies.

This process of laminating two sub-assemblies together can be performed for more than two respective sub-assemblies of a PCB 100 in parallel or in series. For example, a first lamination step can laminate a first sub-assembly 606 to a second sub-assembly 605 forming a new larger sub-assembly. A second lamination step can laminate a third sub-assembly 607 to this new larger sub-assembly. Subsequent lamination steps can laminate fourth, fifth, sixth, and seventh sub-assemblies to the growing sub-assembly to form the resulting final stack that includes all sub-assemblies.

Advantageously, coupling adjacent sub-assemblies together with stud bumps also enables more than two sub-assemblies to be laminated together in a single lamination step. That is, three or more sub-assemblies are each aligned with one another such that stud bumps on one surface align with corresponding pads on an opposing surface. The multiple sub-assemblies are then all pressed together, heated, and then cooled simultaneously, resulting in a laminated stack formed from the multiple sub-assemblies via a single heating, pressing, and cooling cycle. For example, all seven sub-assemblies 602-608 can be laminated together in a single heating, pressing 616, and cooling step. Likewise, all seven sub-assemblies 609-615 can be laminated together in a single heating, pressing 616, and cooling step. Any of the example sub-assemblies described above in FIGS. 3A-H or 4A and 4B can be used for the mating surfaces of the respective sub-assemblies in FIGS. 6A and 6B.

Figures 7A, 7B:
FIGS. 7A and 7B are cross-sectional views of example lamination step(s) forming a rigid-flex PCB wherein sub-assemblies are electrically coupled together with stud bumps as described herein.

FIGS. 7A and 7B are cross-sectional views of example lamination step(s) forming a rigid-flex PCB wherein sub-assemblies are electrically coupled together with stud bumps as described herein. In FIG. 7A, a plurality of rigid sub-assemblies 704 are laminated to respective rigid portions 706 of a sub-assembly 702 having a flexible region 708, FIG. 7B is another example of a plurality of rigid sub-assemblies 714 are laminated to respective rigid portions 716 of a sub-assembly 712 having a flexible region 718. Any of the example sub-assemblies described above in FIGS. 3A-H or 4A and 4B can be used for the mating surfaces of the respective sub-assemblies in FIGS. 7A and 7B. Using stud bumps for vertical interconnects in such a rigid-flex circuit reduces the need for creating blind or through vias to connect the entire stack.

The stud bump interconnect techniques can be used to create PCBs similar to existing PCBs except one or more of the vertical vias are replaced with stud bumps.

Electrically coupling sub-assemblies together with stud bumps as described herein can have several advantages. For example, a laminated stack having many conductive layers and vertical interconnects therebetween can be formed with reduced or eliminated drilling and plating, both of which require additional equipment, additional time, and add additional stress to the circuit. The simultaneous lamination of three or more sub-assemblies together as opposed to sequentially laminating can both reduce time of lamination and reduce the stress added to the circuit via each additional lamination step. Laminating three or more sub-assemblies together simultaneously may also reduce alignment errors as compared with existing processes where multiple sub-assemblies are laminated in separate steps and then a via is drilled. Each lamination step and via drilling in existing processes requires its own alignment procedure. The simultaneous lamination described herein, however, forms the entire laminated stack and the vertical interconnects in a single alignment process.

Additionally, soldered components can be included on or in a sub-assembly prior to lamination with reduced risk of unintentional reflow of the solder. This is because the lamination steps only need heat sufficient to soften the bonding layer, the heat can be held below the solder reflow temperature. This can be used to integrate/attached semiconductor die or packed ICs into or onto a sub-assembly prior to lamination. The sub-assembly can then be laminated to one or more other sub-assemblies such that the semiconductor die or packaged IC is internal to layers of the integrated stack.

The subject matter herein allows for bonding respective sub-assemblies having dis-similar material sets on very fine pitch to create high layer count circuit stacks in rigid, flexible, or rigid-flex configurations. The subject matter also allows for mating multiple circuit-bearing sub-assemblies while localizing tolerance stack-up within the sub-assemblies while aligning the sub-assemblies with precisely placed stud bumps rather than drilled vias. The subject matter also allows for creating a via location without the laser ablation process required for drilling a via target with a capture pad of base metal such that the laser does not ablate beyond the metal target into the underlying material.

What is claimed is:

1. A circuit board comprising:
a plurality of conductive layers including a first conductive layer and a second conductive layer;
a plurality of non-conductive layers in-between respective conductive layers of the plurality of conductive layers, the plurality of non-conductive layers including at least a first non-conductive layer disposed between the first conductive layer and the second conductive layer;
at least one collapsed stud bump extending at least partially through the first non-conductive layer to electrically couple the first conductive layer to the second conductive layer; and
a surface finish layer on the first conductive layer, between the at least one collapsed stud bump and the first conductive layer, the surface finish layer composed of one or more noble metals,
wherein the at least one collapsed stud bump is bonded to the surface finish layer and is in non-bonded contact with the second conductive layer.

2. The circuit board of claim 1, wherein the at least one collapsed stud bump includes a plurality of collapsed stud bumps.

3. The circuit board of claim 1, wherein the at least one collapsed stud bump is composed of gold.

4. The circuit board of claim 1, wherein the first conductive layer and the second conductive layer are internal layers of the circuit board.

5. The circuit board of claim 1, wherein the plurality of conductive layers include a third conductive layer and a fourth conductive layer,
wherein the plurality of non-conductive layers include a second non-conductive layer between the third conductive layer and the fourth conductive layer, wherein the at least one collapsed stud bump includes at least a second collapsed stud bump extending at least partially through the second non-conductive layer to electrically couple the third conductive layer to the fourth conductive layer.

6. The circuit board of claim 1, wherein the at least one collapsed stud bump includes a plurality of collapsed stud bumps extending at least partially through the first non-conductive layer to electrically couple the first conductive layer to the second conductive layer.

\*　\*　\*　\*　\*